United States Patent
Machida et al.

(10) Patent No.: US 10,951,839 B2
(45) Date of Patent: *Mar. 16, 2021

(54) IMAGING APPARATUS INCLUDING UNIT PIXEL, COUNTER ELECTRODE, PHOTOELECTRIC CONVERSION LAYER, AND COMPUTING CIRCUIT

(71) Applicant: PANASONIC INTELLECTUAL PROPERTY MANAGEMENT CO., LTD., Osaka (JP)

(72) Inventors: Shinichi Machida, Osaka (JP); Masashi Murakami, Kyoto (JP); Takeyoshi Tokuhara, Osaka (JP); Masaaki Yanagida, Kyoto (JP); Sanshiro Shishido, Osaka (JP); Manabu Nakata, Osaka (JP); Masumi Izuchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/595,292

(22) Filed: Oct. 7, 2019

(65) Prior Publication Data
US 2020/0036915 A1    Jan. 30, 2020

Related U.S. Application Data

(63) Continuation of application No. 15/873,190, filed on Jan. 17, 2018, now Pat. No. 10,477,121.

(30) Foreign Application Priority Data

Feb. 3, 2017    (JP) .................................. 2017-018776

(51) Int. Cl.
*H04N 5/378* (2011.01)
*H04N 5/374* (2011.01)
(Continued)

(52) U.S. Cl.
CPC ........... *H04N 5/332* (2013.01); *H01L 27/307* (2013.01); *H04N 5/374* (2013.01); *H04N 5/378* (2013.01);
(Continued)

(58) Field of Classification Search
CPC ........ H04N 5/332; H04N 5/378; H04N 5/374; H04N 9/04553; H01L 27/307; Y02E 10/549
(Continued)

(56) References Cited

U.S. PATENT DOCUMENTS 10,199,587 B2 *    2/2019    Udaka ..................... H01L 29/08
                                                  257/40
10,447,121 B2 *    11/2019   Machida ................ H04N 5/332
                                                  348/294
(Continued)

FOREIGN PATENT DOCUMENTS

JP    H07-283384 A    10/1995
JP    2002-502129 A    1/2002
(Continued)

OTHER PUBLICATIONS

Notice of Allowance issued in U.S. Appl. No. 15/873,190, dated Jul. 10, 2019.

*Primary Examiner* — Marly S Camargo
(74) *Attorney, Agent, or Firm* — McDermott Will and Emery LLP

(57) ABSTRACT

An imaging apparatus includes a unit pixel including a pixel electrode; a counter electrode facing the pixel electrode; a photoelectric conversion layer disposed between the pixel
(Continued)

electrode and the counter electrode; and a computing circuit that acquires a first signal upon a first voltage being applied between the pixel electrode and the counter electrode, the first signal corresponding to an image captured with visible light and infrared light and a second signal upon a second voltage being applied between the pixel electrode and the counter electrode, the second signal corresponding to an image captured with visible light, and generates a third signal by performing a computation using the first signal and the second signal, the third signal corresponding to an image captured with infrared light.

17 Claims, 7 Drawing Sheets

(51) Int. Cl.
   *H04N 9/04* (2006.01)
   *H01L 27/30* (2006.01)
   *H04N 5/33* (2006.01)

(52) U.S. Cl.
   CPC ........ *H04N 9/04553* (2018.08); *Y02E 10/549* (2013.01)

(58) Field of Classification Search
   USPC ...... 348/294, 308, 302, 222.1, 292, 290, 33, 348/164; 257/291, 292, 204, 294, 231, 257/239, 241, 242, 227; 250/208.1, 250/316.1, 330, 338.1, 339.05, 339.14, 250/495
   See application file for complete search history.

(56) References Cited

U.S. PATENT DOCUMENTS

| | | |
|---|---|---|
| 2004/0056180 A1 | 3/2004 | Yu |
| 2009/0101953 A1 | 4/2009 | Hayashi et al. |
| 2013/0089237 A1 | 4/2013 | Sargent et al. |
| 2015/0207087 A1 | 7/2015 | Udaka et al. |
| 2016/0119562 A1 | 4/2016 | Takase et al. |
| 2017/0163917 A1 | 6/2017 | Yamada et al. |
| 2018/0047788 A1 | 2/2018 | Nozawa |
| 2018/0167562 A1 | 6/2018 | Suzuki et al. |
| 2018/0227524 A1 | 8/2018 | Machida et al. |

FOREIGN PATENT DOCUMENTS

| | | |
|---|---|---|
| JP | 2008-227092 A | 9/2008 |
| JP | 2010-109875 A | 5/2010 |
| JP | 2011-015086 A | 1/2011 |
| JP | 2014-531080 A | 11/2014 |
| JP | WP2014/024581 A1 | 7/2016 |
| WO | 99/039395 A1 | 8/1999 |
| WO | 2013/055777 A1 | 4/2013 |

* cited by examiner

RGB+IR

RGB

IR

US 10,951,839 B2

IMAGING APPARATUS INCLUDING UNIT PIXEL, COUNTER ELECTRODE, PHOTOELECTRIC CONVERSION LAYER, AND COMPUTING CIRCUIT

CROSS-REFERENCE OF RELATED APPLICATIONS

This application is a Continuation of U.S. patent application Ser. No. 15/873,190, filed on Jan. 17, 2018, now U.S. Pat. No. 10,477,121, which claims the benefit of Japanese Application No. 2017-018776, filed on Feb. 3, 2017, the entire disclosures of which Applications are incorporated by reference herein.

BACKGROUND

1. Technical Field

The present disclosure relates to an imaging apparatus.

2. Description of the Related Art

When a color image based on visible light and a monochrome image based on infrared light are captured with one image sensor in the environment in which the intensity of infrared light is high, infrared light degrades color reproductivity. Accordingly, there has been devised a technique in which an infrared cutoff filter capable of blocking infrared light is disposed on the front surface of the sensor prior to the capturing of a color image in order to achieve good color reproductivity (e.g., see Japanese Unexamined Patent Application Publication No. 2010-109875). The infrared cutoff filter may be removed, for example, at nighttime in order to capture a monochrome image. In the case where the ambient light includes both infrared light and visible light, using a visible-light cutoff filter capable of blocking visible light may enable the capturing of an image based on only infrared light.

SUMMARY

In one general aspect, the techniques disclosed here feature an imaging apparatus including a unit pixel including a pixel electrode, a charge accumulation region electrically connected to the pixel electrode, and a signal detection circuit electrically connected to the charge accumulation region; a counter electrode facing the pixel electrode; a photoelectric conversion layer disposed between the pixel electrode and the counter electrode; and a computing circuit. The photoelectric conversion layer converts visible light and infrared light into a first electrical signal upon a first voltage being applied between the pixel electrode and the counter electrode. The photoelectric conversion layer converts the visible light into a second electrical signal upon a second voltage being applied between the pixel electrode and the counter electrode, the second voltage being different from the first voltage. The computing circuit acquires a first signal on a basis of the first electrical signal upon the first voltage being applied between the pixel electrode and the counter electrode, the first signal corresponding to an image captured with the visible light and the infrared light. The computing circuit acquires a second signal on a basis of the second electrical signal upon the second voltage being applied between the pixel electrode and the counter electrode, the second signal corresponding to an image captured with the visible light. The computing circuit generates a third signal by performing a computation using the first signal and the second signal, the third signal corresponding to an image captured with the infrared light.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
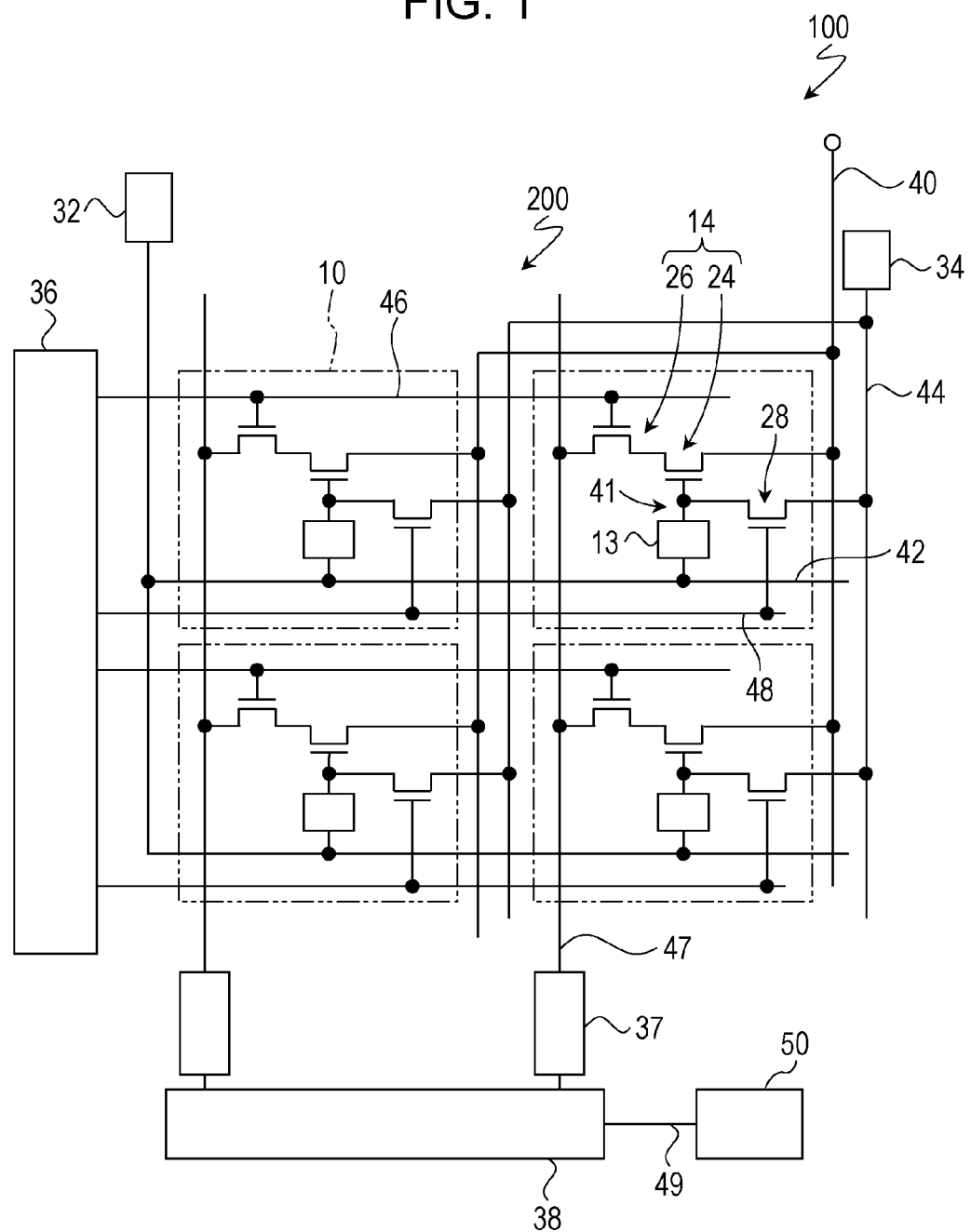
FIG. 1 is a schematic diagram illustrating an exemplary circuit structure of an imaging apparatus according to an embodiment.

When the imaging method described in Description of the Related Art above, in which a switchover between color imaging and infrared imaging is performed by mechanically attaching or detaching a movable filter, is used, it is not possible to capture good images while the filter is attached to or detached from the sensor. Therefore, the above imaging method is useful in applications where the switchover between color imaging and infrared monochrome imaging is performed at a low frequency as in day-night cameras. However, in the case where a color image and an infrared image are simultaneously captured by the imaging method, the motion of the subject which is made while the filter is attached to or detached from the sensor causes motion blur. Furthermore, it is not preferable to move the movable part repeatedly at a high speed in consideration of the durability and power consumption of the imaging apparatus.

An imaging apparatus according to an embodiment of the present disclosure includes a unit pixel including a pixel electrode, a charge accumulation region electrically connected to the pixel electrode, and a signal detection circuit electrically connected to the charge accumulation region; a counter electrode facing the pixel electrode; a photoelectric conversion layer disposed between the pixel electrode and the counter electrode; and a computing circuit.

The photoelectric conversion layer converts visible light and infrared light into a first electrical signal upon a first voltage being applied between the pixel electrode and the counter electrode.

The photoelectric conversion layer converts the visible light into a second electrical signal upon a second voltage being applied between the pixel electrode and the counter electrode, the second voltage being different from the first voltage.

The computing circuit acquires a first signal on a basis of the first electrical signal upon the first voltage being applied between the pixel electrode and the counter electrode, the first signal corresponding to an image captured with the visible light and the infrared light.

The computing circuit acquires a second signal on a basis of the second electrical signal upon the second voltage being applied between the pixel electrode and the counter electrode, the second signal corresponding to an image captured with the visible light.

The computing circuit generates a third signal by performing a computation using the first signal and the second signal, the third signal corresponding to an image captured with the infrared light.

The above-described imaging apparatus is capable of performing a switchover between imaging using visible light and imaging using visible light and infrared light simultaneously for all pixels by changing the voltage applied to the photoelectric conversion layer. The imaging apparatus is also capable of generating an image captured using infrared light from an image captured using visible light and an image captured using visible light and infrared light. Thus, the imaging apparatus is capable of capturing an image based on visible light, an image based on visible light and infrared light, and an image based on infrared light without using a movable filter.

The imaging apparatus according to an embodiment of the present disclosure may further include a voltage supply circuit configured to selectively apply the first voltage or the second voltage between the pixel electrode and the counter electrode.

In the imaging apparatus according to an embodiment of the present disclosure, the computing circuit may generate the third signal by subtracting, from the first signal, a signal obtained by multiplying the second signal by a gain.

In the imaging apparatus according to an embodiment of the present disclosure, the gain may correspond to the ratio of a quantum efficiency of the photoelectric conversion layer which is achieved upon the first voltage being applied between the pixel electrode and the counter electrode to a quantum efficiency of the photoelectric conversion layer which is achieved upon the second voltage being applied between the pixel electrode and the counter electrode.

In the imaging apparatus according to an embodiment of the present disclosure, the gain may correspond to the product of the ratio of a quantum efficiency of the photoelectric conversion layer which is achieved upon the first voltage being applied between the pixel electrode and the counter electrode to a quantum efficiency of the photoelectric conversion layer which is achieved upon the second voltage being applied between the pixel electrode and the counter electrode, and the ratio of a first exposure time to a second exposure time, the first exposure time being a time during which the first voltage is applied between the pixel electrode and the counter electrode, the second exposure time being a time during which the second voltage is applied between the pixel electrode and the counter electrode.

In the imaging apparatus according to an embodiment of the present disclosure, the computing circuit may generate the third signal by subtracting a fifth signal from a fourth signal, the fourth signal being obtained by multiplying the first signal by a first gain, the fifth signal being obtained by multiplying the second signal by a second gain, the second gain being different from the first gain.

In the imaging apparatus according to an embodiment of the present disclosure, the ratio of the first gain to the second gain may correspond to the ratio of a quantum efficiency of the photoelectric conversion layer which is achieved upon the first voltage being applied between the pixel electrode and the counter electrode to a quantum efficiency of the photoelectric conversion layer which is achieved upon the second voltage being applied between the pixel electrode and the counter electrode.

In the imaging apparatus according to an embodiment of the present disclosure, the ratio of the first gain to the second gain may correspond to the product of the ratio of a quantum efficiency of the photoelectric conversion layer which is achieved upon the first voltage being applied between the pixel electrode and the counter electrode to a quantum efficiency of the photoelectric conversion layer which is achieved upon the second voltage being applied between the pixel electrode and the counter electrode, and the ratio of a first exposure time to a second exposure time, the first exposure time being a time during which the first voltage is applied between the pixel electrode and the counter electrode, the second exposure time being a time during which the second voltage is applied between the pixel electrode and the counter electrode.

In the imaging apparatus according to an embodiment of the present disclosure, the first exposure time may be shorter than the second exposure time.

In the imaging apparatus according to an embodiment of the present disclosure, the photoelectric conversion layer may include photoelectric conversion films.

In the imaging apparatus according to an embodiment of the present disclosure, at least one of the photoelectric conversion films may include an organic material.

In the present disclosure, all or a part of a circuit, a unit, a device, a member, or a portion, or a part or all of functional blocks in the block diagrams may be implemented as one or more of electronic circuits including, but not limited to, a semiconductor device, a semiconductor integrated circuit (IC) or a large scale integration (LSI). The LSI or IC may be integrated into one chip, or may alternatively be a combination of plural chips. For example, functional blocks other than a memory may be integrated into one chip. Although an LSI and an IC are referred to above, the terms for the circuits may vary depending on the degree of integration; they may also be referred to as system LSI, very large scale integration (VLSI), or ultra large scale integration (ULSI). A field programmable gate array (FPGA) that can be programmed after manufacturing an LSI or a reconfigurable logic device that allows reconfiguration of the connection or setup of circuit cells inside the LSI can be used for the same purpose.

Furthermore, all or a part of the functions or operations of a circuit, a unit, a device, a member, or a portion may be implemented by executing software. In such a case, the software is recorded on one or more non-transitory recording media such as a ROM, an optical disk or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

Embodiments of the present disclosure are described below in detail with reference to the attached drawings. In the following embodiments, general or specific examples are described. All the values, shapes, materials, components, the arrangement of the components, and the connection between the components, steps, the order of the steps, and the like described in the following embodiments are merely an example and are not intended to limit the scope of the present disclosure. The various aspects described herein may be combined with one another unless a contradiction arises. Among the components described in the following embodiments, components that are not described in any one of the independent claims, which indicate the broadest concepts, are described as optional components. In the following description, components that have substantially the same function are denoted by the same reference numeral, and the description thereof may be omitted.

Imaging Apparatus

FIG. 1 is an exemplary circuit structure of an imaging apparatus according to an embodiment of the present disclosure. The imaging apparatus 100 illustrated in FIG. 1 includes a pixel array 200 that includes a plurality of unit pixels 10 arranged in a two-dimensional array. FIG. 1 schematically illustrates an example where the unit pixels 10 are arranged in a matrix having two rows and two columns. The number and arrangement of the unit pixels 10 included in the imaging apparatus 100 are not limited to those in the example illustrated in FIG. 1.

The unit pixels 10 each include a photoelectric conversion unit 13 and a signal detection circuit 14. As described below with reference to the drawings, the photoelectric conversion unit 13 includes two electrodes facing each other and a photoelectric conversion layer interposed therebetween and generates signal charge carriers upon receiving incident light. The photoelectric conversion unit 13 is not necessarily an element in which all the components are exclusively provided for each of the unit pixels 10. For example, some or all of the components of the photoelectric conversion unit 13 may extend across the plurality of unit pixels 10. In this embodiment, a portion or the entirety of the incident-light-side electrode extends across the plurality of unit pixels 10.

The signal detection circuit 14 is a circuit that detects the signal generated by the photoelectric conversion unit 13. In this example, the signal detection circuit 14 includes a signal detection transistor 24 and an address transistor 26. The signal detection transistor 24 and the address transistor 26 are typically field-effect transistors (FETs). In this example, the signal detection transistor 24 and the address transistor 26 are N-channel metal oxide semiconductor field effect transistors (MOSFETs).

As described schematically in FIG. 1, the control terminal (i.e., the gate) of the signal detection transistor 24 is electrically connected to the photoelectric conversion unit 13. The signal charge carriers (i.e., holes or electrons) generated by the photoelectric conversion unit 13 are accumulated at a charge accumulation node 41 (also referred to as "floating diffusion node"), which is located between the gate of the signal detection transistor 24 and the photoelectric conversion unit 13. The charge accumulation node 41 corresponds to a charge accumulation region. The detailed structure of the photoelectric conversion unit 13 is described below.

The photoelectric conversion unit 13 included in each unit pixel 10 is further connected to the corresponding one of sensitivity control lines 42. In the example structure illustrated in FIG. 1, the sensitivity control lines 42 are connected to a voltage supply circuit 32. The voltage supply circuit 32 is a circuit capable of selectively applying any one of at least three types of voltages, that is, a first voltage, a second voltage, and a third voltage, to the photoelectric conversion units 13. While the imaging apparatus 100 is operated, the voltage supply circuit 32 applies a predetermined voltage to the photoelectric conversion units 13 through the sensitivity control lines 42. The voltage supply circuit 32 is not limited to a specific power source circuit. The voltage supply circuit 32 may be a circuit that generates the predetermined voltage or a circuit that converts a voltage applied by another power source into the predetermined voltage. As is described below in detail, upon the voltage supply circuit 32 changing the voltage applied to the photoelectric conversion units 13 among the plurality of voltages different from one another, the accumulation of the signal charge carriers generated by the photoelectric conversion unit 13 at the charge accumulation node 41 is started or terminated. In other words, in this embodiment, upon the voltage supply circuit 32 changing the voltage applied to the photoelectric conversion unit 13 from the third voltage to another voltage, the action of an electronic shutter is executed. An example of the action of the imaging apparatus 100 is described below.

The unit pixels 10 are each connected to a power source line 40, through which a power source voltage VDD is supplied. As illustrated in FIG. 1, the power source line 40 is connected to the input terminal (typically, the drain) of the signal detection transistor 24. The power source line 40 serves as a source-follower power source, which enables the signal detection transistor 24 to amplify the signal charge carriers generated by the photoelectric conversion unit 13 to a voltage appropriate to the signal charge carriers and to output the amplified signal as a signal voltage.

The output terminal (i.e., the source) of the signal detection transistor 24 is connected to the input terminal (i.e., the drain) of the address transistor 26. The output terminal (i.e., the source) of the address transistor 26 is connected to the corresponding one of a plurality of vertical signal lines 47, which are provided for the respective columns of the pixel array 200. The control terminal (i.e., the gate) of the address transistor 26 is connected to the corresponding one of address control lines 46. Controlling the potentials of the address control lines 46 enables the data output from the signal detection transistors 24 to be each selectively read through the corresponding one of the vertical signal lines 47.

In the example illustrated in FIG. 1, the address control lines 46 are connected to a vertical scanning circuit 36 (also referred to as "row scanning circuit"). The vertical scanning circuit 36 selects a plurality of the unit pixels 10 disposed in each row on a row-by-row basis by applying a predetermined voltage to the corresponding one of the address control lines 46. This enables the readout of the signals from the selected unit pixels 10.

The vertical signal lines 47 are main signal lines through which pixel signals output from the pixel array 200 are transmitted to the peripheral circuits. The vertical signal lines 47 are each connected to the corresponding one of column-signal processing circuits 37 (also referred to as "row-signal accumulation circuits"). The column-signal processing circuits 37 perform noise-reduction signal processing, such as correlated double sampling, analog-digital conversion (AD conversion), and the like. As illustrated in FIG. 1, the column-signal processing circuits 37 are provided for the respective columns of the unit pixels 10 in the pixel array 200. The column-signal processing circuits 37 are connected to a horizontal signal readout circuit 38 (also referred to as "column-scanning circuit"), which sequentially reads a signal from each of the column-signal processing circuits 37 to a horizontal common signal line 49.

In the example structure illustrated in FIG. 1, the unit pixels 10 each include a reset transistor 28. The reset transistor 28 is a field-effect transistor or the like, similarly to the signal detection transistor 24 and the address transistor 26. In the example described below, the reset transistor 28 is an N-channel MOSFET unless otherwise specified. As illustrated in FIG. 1, the reset transistor 28 is connected to a reset voltage line 44, through which a reset voltage Vr is supplied, and to the charge accumulation node 41. The control terminal (i.e., the gate) of the reset transistor 28 is connected to the corresponding one of reset control lines 48, and the potential of the charge accumulation node 41 can be reset to the reset voltage Vr by controlling the potential of the reset control line 48. In this example, the reset control lines 48 are connected to the vertical scanning circuit 36. Thus, it is possible to reset a plurality of the unit pixels 10 which are disposed in each row on a row-by-row basis by the vertical scanning circuit 36 applying a predetermined voltage to the corresponding one of the reset control lines 48.

In this example, the reset voltage line 44, through which the reset voltage Vr is supplied to the reset transistors 28, is connected to a reset voltage source 34. The reset voltage source 34 may have any structure that allows a predetermined reset voltage Vr to be supplied through the reset voltage line 44 during the operation of the imaging apparatus 100 and is not limited to a specific power source circuit, similarly to the voltage supply circuit 32 described above. The voltage supply circuit 32 and the reset voltage source 34 may be parts of a single voltage supply circuit or independent voltage supply circuits. One or both of the voltage supply circuit 32 and the reset voltage source 34 may be a part of the vertical scanning circuit 36. Alternatively, a sensitivity control voltage may be applied by the voltage supply circuit 32 to the unit pixels 10 via the vertical scanning circuit 36, and/or the reset voltage Vr may be applied by the reset voltage source 34 to the unit pixels 10 via the vertical scanning circuit 36.

The power source voltage VDD supplied to the signal detection circuits 14 may be used also as a reset voltage Vr. In such a case, the reset voltage source 34 may be used also as a voltage supply circuit (not illustrated in FIG. 1) that supplies a power source voltage to the unit pixels 10. Furthermore, it is possible to use the power source line 40 also as the reset voltage line 44, which allows the arrangement of wires in the pixel array 200 to be simplified. However, setting the reset voltage Vr to be different from the power source voltage VDD supplied to the signal detection circuits 14 increases the degree of flexibility in the control of the imaging apparatus 100.

Device Structure of Unit Pixel

Figure 2:
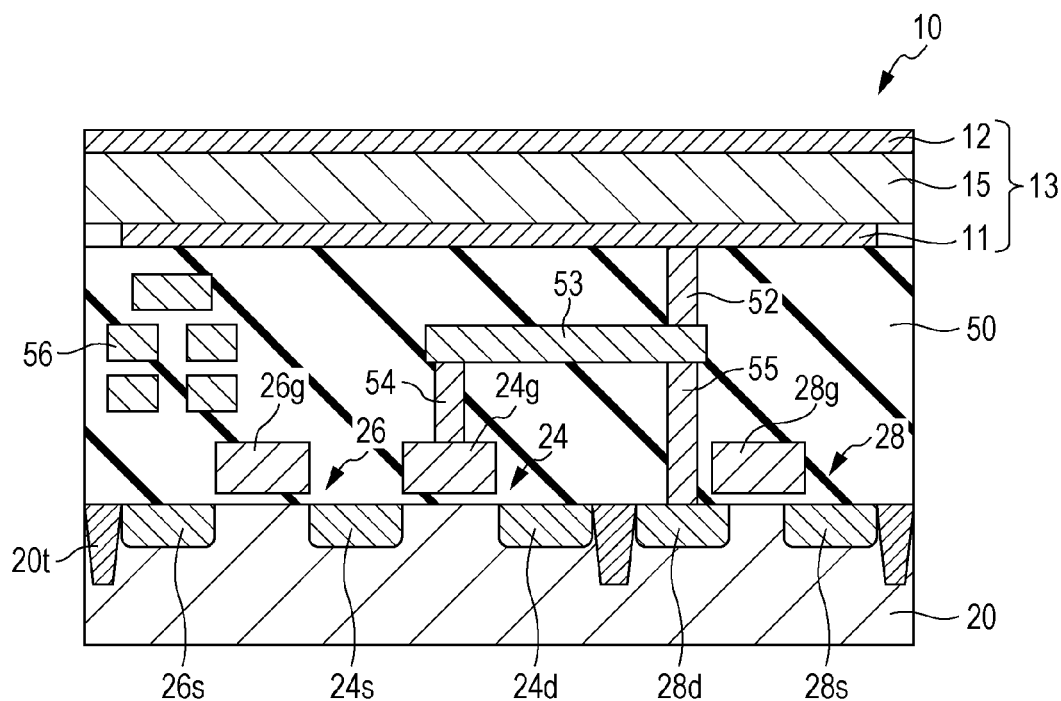
FIG. 2 is a schematic cross-sectional view of a unit pixel according to an embodiment, illustrating an exemplary device structure of the unit pixel.

FIG. 2 schematically illustrates an exemplary device structure of the unit pixels 10. In the exemplary structure illustrated in FIG. 2, the above-described signal detection transistor 24, the address transistor 26, and the reset transistor 28 are disposed on a semiconductor substrate 20. The semiconductor substrate 20 is not limited to a substrate the entirety of which is composed of a semiconductor and may be an insulating substrate that includes a semiconductor layer disposed on a surface thereof on which a photosensitive region is to be formed. In the example described below, a p-type silicon (Si) substrate is used as a semiconductor substrate 20.

The semiconductor substrate 20 includes impurity regions (in this example, N-type regions) 26s, 24s, 24d, 28d, and 28s. The semiconductor substrate 20 also includes element separation regions 20t in order to electrically separate the unit pixels 10 from one another. In this example, an element separation region 20t is interposed also between the impurity regions 24d and 28d. The element separation regions 20t can be formed by, for example, injecting acceptor ions into the semiconductor substrate 20 under predetermined injection conditions.

The impurity regions 26s, 24s, 24d, 28d, and 28s are typically diffusion layers formed in the semiconductor substrate 20. As schematically illustrated in FIG. 2, the signal detection transistor 24 includes impurity regions 24s and 24d and a gate electrode 24g (typically, a polysilicon electrode). The impurity regions 24s and 24d serve as, for example, the source region and the drain region, respectively, of the signal detection transistor 24. The channel region of the signal detection transistor 24 is formed between the impurity regions 24s and 24d.

Similarly to the signal detection transistor 24, the address transistor 26 includes impurity regions 26s and 24s and a gate electrode 26g (typically, a polysilicon electrode), which is connected to the corresponding one of the address control lines 46 (see FIG. 1). In this example, the signal detection transistor 24 and the address transistor 26 are electrically connected to each other by sharing the impurity region 24s. The impurity region 26s serves as, for example, the source region of the address transistor 26. The impurity region 26s is connected to the corresponding one of vertical signal lines 47, which is not illustrated in FIG. 2 (see FIG. 1).

The reset transistor 28 includes impurity regions 28d and 28s and a gate electrode 28g (typically, a polysilicon electrode) connected to the corresponding one of reset control lines 48 (see FIG. 1). The impurity region 28s serves as, for example, the source region of the reset transistor 28. The impurity region 28s is connected to the reset voltage line 44, which is not illustrated in FIG. 2 (see FIG. 1).

An interlayer insulating layer 50 (typically, a silicon dioxide layer) is disposed on the semiconductor substrate 20 so as to cover the signal detection transistor 24, the address transistor 26, and the reset transistor 28. The interlayer insulating layer 50 may include a wiring layer 56 formed therein as illustrated in FIG. 2. The wiring layer 56 is typically composed of a metal, such as copper, and may include wires such as the vertical signal lines 47 described above. The number of insulating sublayers constituting the interlayer insulating layer 50 and the number of wiring sublayers constituting the wiring layer 56 formed in the interlayer insulating layer 50 may be set appropriately and not limited to those in the example illustrated in FIG. 2.

The above-described photoelectric conversion unit 13 is disposed on the interlayer insulating layer 50. In other words, in this embodiment, a plurality of unit pixels 10 constituting a pixel array 200 (see FIG. 1) are formed on the semiconductor substrate 20. The unit pixels 10, which are arranged on the semiconductor substrate 20 in a two-dimensional array, form a photosensitive region. The distance (i.e., pixel pitch) between a pair of adjacent unit pixels 10 is, for example, about 2 μm.

The photoelectric conversion unit 13 includes a pixel electrode 11, a counter electrode 12, and a photoelectric conversion layer 15 interposed therebetween. In this example, the counter electrode 12 and the photoelectric conversion layer 15 are formed so as to extend across a plurality of the unit pixels 10.

On the other hand, each of the unit pixels 10 is provided with one pixel electrode 11. Each of the pixel electrodes 11 is electrically separated from other pixel electrodes 11 included in the adjacent unit pixels 10 by being spatially separated from them.

The counter electrode 12 is typically a transparent electrode composed of a transparent conducting material. The counter electrode 12 is disposed on a side of the photoelectric conversion layer 15 on which light enters. That is, light that have permeated through the counter electrode 12 enters the photoelectric conversion layer 15. The wavelength of light that can be detected by the imaging apparatus 100 is not limited to be within the wavelength range (e.g., 380 nm or more and 780 nm or less) of visible light. The term "transparent" used herein refers to passing at least part of light having a wavelength that falls within the detectable wavelength range. Hereinafter, all electromagnetic waves including infrared radiation and ultraviolet radiation are collectively referred to as "light" for the sake of convenience. The counter electrode 12 may be composed of, for example, a transparent conducting oxide (TCO), such as indium-doped tin oxide (ITO), indium zinc oxide (IZO), aluminium-doped zinc oxide (AZO), fluorine-doped tin oxide (FTO), $SnO_2$, $TiO_2$, or $ZnO_2$.

The photoelectric conversion layer 15 generates electron-hole pairs upon receiving the incident light. In this embodiment, the photoelectric conversion layer 15 is composed of an organic material. Specific examples of the material for the photoelectric conversion layer 15 are described below.

As described above with reference to FIG. 1, the counter electrode 12 is connected to the corresponding one of the sensitivity control lines 42, which are connected to the voltage supply circuit 32. In this embodiment, the counter electrode 12 is formed so as to extend across a plurality of the unit pixels 10. This enables the voltage supply circuit 32 to apply a desired sensitivity control voltage to a plurality of the unit pixels 10 at a time through the sensitivity control lines 42. Each of the unit pixels 10 may be provided with one counter electrode 12 as long as a desired sensitivity control voltage can be applied from the voltage supply circuit 32. Similarly, each of the unit pixels 10 may be provided with one photoelectric conversion layer 15.

As described below in detail, the voltage supply circuit 32 applies different voltages to the counter electrode 12 during the exposure period and the non-exposure period. The term "exposure period" used herein refers to the period in which positive or negative charge carriers generated by the photoelectric conversion are accumulated at the charge accumulation region and may be referred to also as "charge accumulation period". The term "non-exposure period" used herein refers to the period in which the imaging apparatus is operated and which is other than the exposure period. The "non-exposure period" is not limited to the period during which the photoelectric conversion unit 13 is not irradiated with light and may include the period during which the photoelectric conversion unit 13 is irradiated with light.

Controlling the potential of the counter electrode 12 with respect to the pixel electrode 11 enables holes or electrons of the electron-hole pairs generated in the photoelectric conversion layer 15 by photoelectric conversion to be collected by the pixel electrode 11. For example, in the case where holes are used as signal charge carriers, setting the potential of the counter electrode 12 to be higher than that of the pixel electrode 11 enables the holes to be selectively collected by the pixel electrode 11. In the example described below, holes are used as signal charge carriers. Needless to say that electrons may alternatively be used as signal charge carriers.

The pixel electrode 11, which faces the counter electrode 12, collects positive or negative charge carriers generated in the photoelectric conversion layer 15 by photoelectric conversion upon an appropriate bias voltage being applied between the counter electrode 12 and the pixel electrode 11. The pixel electrode 11 is composed of a metal, such as aluminium or copper, a nitride of the metal, or a polysilicon or the like which is made conductive by being doped with an impurity.

The pixel electrode 11 may have a light-blocking property. When the pixel electrode 11 is, for example, a TaN electrode having a thickness of 100 nm, the pixel electrode 11 may have a sufficient light-blocking property. Using an electrode having a light-blocking property as a pixel electrode 11 may reduce the intrusion of light that permeates through the photoelectric conversion layer 15 into the channel regions or the impurity regions of the transistors (in this example, at least one of the signal detection transistor 24, the address transistor 26, and the reset transistor 28) formed on the semiconductor substrate 20. A light-blocking film may optionally be formed in the interlayer insulating layer 50 by using the wiring layer 56 described above. Reducing the intrusion of the light into the channel regions of the transistors formed on the semiconductor substrate 20 may limit a shift of the properties of the transistors (e.g., the fluctuations in threshold voltage). Reducing the intrusion of the light into the impurity regions formed on the semiconductor substrate 20 may limit the mixing of noises generated as a result of unintended photoelectric conversion occurring in the impurity regions. Thus, reducing the intrusion of the light into the semiconductor substrate 20 increases the reliability of the imaging apparatus 100.

As schematically illustrated in FIG. 2, the pixel electrode 11 is connected to the gate electrode 24g of the signal detection transistor 24 with a plug 52, a wire 53, and a contact plug 54. In other words, the gate of the signal detection transistor 24 is electrically connected with the pixel electrode 11. The plug 52 and the wire 53 are composed of, for example, a metal, such as copper. The plug 52, the wire 53, and the contact plug 54 constitute at least a part of the charge accumulation node 41 (see FIG. 1), which is located between the signal detection transistor 24 and the photoelectric conversion unit 13. The wire 53 may constitute a part of the wiring layer 56. The pixel electrode 11 is also connected to the impurity region 28d with the plug 52, the wire 53, and a contact plug 55. In the exemplary structure illustrated in FIG. 2, the gate electrode 24g of the signal detection transistor 24, the plug 52, the wire 53, the contact plugs 54 and 55, and the impurity region 28d, which serves as a source or drain region of the reset transistor 28, serve as a charge accumulation region at which the signal charge carriers collected by the pixel electrode 11 are accumulated.

Upon the signal charge carriers being collected by the pixel electrode 11, a voltage responsive to the amount of signal charge carriers accumulated at the charge accumulation region is applied to the gate of the signal detection transistor 24. The signal detection transistor 24 amplifies the voltage. The voltage amplified by the signal detection transistor 24 is selectively read as a signal voltage via the address transistor 26.

Example Structure of Photoelectric Conversion Layer

As described above, when the photoelectric conversion layer 15 is irradiated with light and a bias voltage is applied between the pixel electrode 11 and the counter electrode 12, positive or negative charge carriers generated by photoelectric conversion are collected by the pixel electrode 11 and the collected charge carriers are accumulated at the charge accumulation region. In this embodiment, the photoelectric conversion unit 13 includes a photosensitive layer 15A including two photoelectric conversion films that have different absorption spectra and stacked on top of each other under specific conditions, which is described below. This enables the wavelength sensitivity characteristic of the photoelectric conversion layer 15, that is, the imaging wavelength range, to be changed by controlling the difference in potential between the pixel electrode 11 and the counter electrode 12. Furthermore, limiting the difference in potential between the pixel electrode 11 and the counter electrode 12 to be equal to or smaller than a predetermined potential prevents the migration of the signal charge carriers accumulated at the charge accumulation region into the counter electrode 12 through the photoelectric conversion layer 15. Limiting the difference in potential between the pixel electrode 11 and the counter electrode 12 to be equal to or smaller than a predetermined potential also reduces the likelihood of the signal charge carriers being further accumulated at the charge accumulation region. The above is one of the findings made by the inventors. That is, it is possible to achieve a global shutter and electrical switchover of the imaging wavelength by controlling the bias voltage applied to the photoelectric conversion layer 15 without optional elements such as transfer transistors being disposed on the respective pixels. A typical example of the action of the imaging apparatus 100 is described below.

An example structure of the photoelectric conversion layer 15 and the wavelength sensitivity characteristic of the photoelectric conversion layer 15 are described below.

Figure 3:
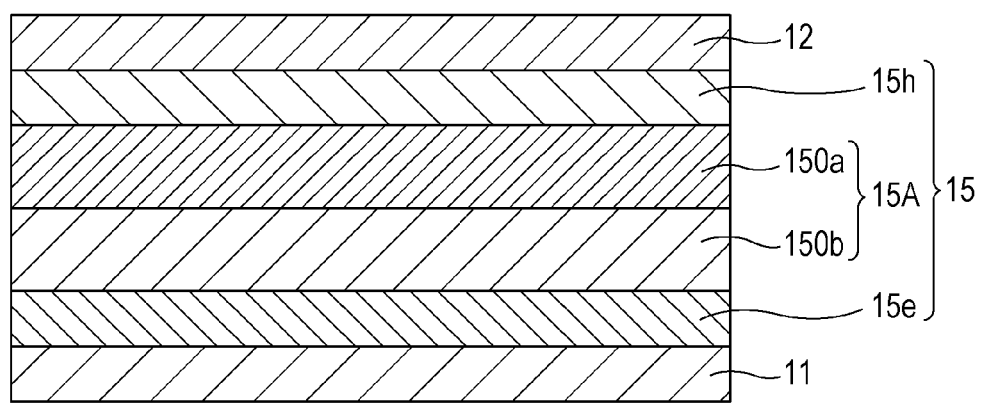
FIG. 3 is a schematic cross-sectional view of a photoelectric conversion layer according to an embodiment, illustrating an example structure of the photoelectric conversion layer.

FIG. 3 is a schematic cross-sectional view of a photoelectric conversion layer 15, illustrating an example structure of the photoelectric conversion layer 15. In the structure illustrated in FIG. 3, the photoelectric conversion layer 15 includes a hole-blocking layer 15h, the photosensitive layer 15A, and an electron-blocking layer 15e. The hole-blocking layer 15h is interposed between the photosensitive layer 15A and the counter electrode 12. The electron-blocking layer 15e is interposed between the photosensitive layer 15A and the pixel electrode 11. The photoelectric conversion layer 15 typically includes a semiconductor material. In this embodiment, an organic semiconductor material is used as a semiconductor material. The organic semiconductor material may be any organic semiconductor material that has absorption peaks at imaging wavelengths required for imaging. Common photoelectric conversion films are produced from a mixture of an electron-donating organic semiconductor material and an electron-accepting organic semiconductor material. This enables the strength of electric field required for separating excitons generated in the photoelectric conversion layer 15 into electrons and holes to be reduced to a level adequate for use as a semiconductor element. In other words, the quantum efficiency at the same voltage may be increased, and the photoelectric conversion characteristic may be improved.

In this embodiment, a first photoelectric conversion film 150a disposed on the counter-electrode-12-side has a wavelength sensitivity characteristic such that the first photoelectric conversion film 150a is sensitive only in the visible region, and the second photoelectric conversion film 150b disposed on the pixel-electrode-11-side has a wavelength sensitivity characteristic such that the second photoelectric conversion film 150b has a sensitivity in the visible region and a higher sensitivity in the infrared region than in the visible region. Hereinafter, having a sensitivity lower than one tenth of the peak wavelength is considered to be having no sensitivity.

Since the photoelectric conversion layer 15 is composed of organic semiconductor materials, it is possible to control the amount of signal charge carriers that reach the pixel electrode 11 by changing the voltage applied between the counter electrode 12 and the pixel electrode 11. This is because an organic semiconductor material has a considerably low carrier transporting capability and, therefore, the charge carriers generated in the photoelectric conversion layer 15 may be lost as a result of, for example, recombination while migrating through the photoelectric conversion layer 15 when the strength of the electric field that attracts the charge carriers toward the pixel electrode 11 is not large.

In this embodiment, the first photoelectric conversion film 150a and the second photoelectric conversion film 150b that have different absorption spectra are interposed between the counter electrode 12 and the pixel electrode 11. This enables the amount of signal charge carriers transported to the pixel electrode 11 to be controlled in accordance with the voltage applied between the counter electrode 12 and the pixel electrode 11 only when the first photoelectric conversion film 150a and the second photoelectric conversion film 150b satisfy predetermined conditions. This is also one of the findings made by the inventors.

An example of the predetermined conditions is to make the resistances of the first photoelectric conversion film 150a and the second photoelectric conversion film 150b different from each other by a certain degree or more. The voltage applied between the counter electrode 12 and the pixel electrode 11 is distributed at the ratio between the resistances of the first photoelectric conversion film 150a and the second photoelectric conversion film 150b. Making the resistances of the first photoelectric conversion film 150a and the second photoelectric conversion film 150b different from each other by, for example, 44 times or more enables most of the voltage applied between the electrodes to be distributed to the photoelectric conversion film having a higher resistance and the voltage distributed to the other photoelectric conversion film to be reduced to the photoelectric conversion threshold or less. Therefore, when the voltage applied between the counter electrode 12 and the pixel electrode 11 is low, an electric field equal to or higher than the photoelectric conversion threshold is applied only to the photoelectric conversion film having a higher resistance, and only the signal charge carriers generated in the photoelectric conversion film having a higher resistance are transported to the pixel electrode 11. When the voltage applied between the counter electrode 12 and the pixel electrode 11 is increased, an electric field equal to or higher than the photoelectric conversion threshold is applied also to the photoelectric conversion film having a lower resistance, and the photoelectric conversion film having a lower resistance becomes capable of transporting the signal charge carriers to the pixel electrode 11. The resistance of each of the photoelectric conversion films can be adjusted by changing the energy levels of an electron-donating material and an electron-accepting material that constitute the photoelectric conversion film, the mixing ratio between the electron-donating material and the electron-accepting material, the thickness of the photoelectric conversion film, and the like.

When the voltage applied to the photoelectric conversion layer 15 (i.e., the voltage applied between the counter electrode 12 and the pixel electrode 11) is lower than both of the photoelectric conversion thresholds of the first photoelectric conversion film 150a and the second photoelectric conversion film 150b stacked on top of each other, both photoelectric conversion layers become incapable of transporting the signal charge carriers to the pixel electrode. As a result, the wavelength sensitivities of the first photoelectric conversion film 150a and the second photoelectric conversion film 150b become substantially zero, and the first photoelectric conversion film 150a and the second photoelectric conversion film 150b become insensitive. Thus, by selecting the voltage applied between the counter electrode 12 and the pixel electrode 11, it is possible to perform a switchover among the state in which the photoelectric conversion films do not have a photoelectric conversion sensitivity over the entire wavelength range, the state in which only one of the first photoelectric conversion film 150a and the second photoelectric conversion film 150b constituting the photosensitive layer 15A has a photoelectric conversion sensitivity, and the state in which both of the first photoelectric conversion film 150a and the second photoelectric conversion film 150b constituting the photosensitive layer 15A have a photoelectric conversion sensitivity. As described above, it is possible to change the wavelength sensitivity characteristic of the photoelectric conversion layer 15, that is, the imaging wavelength range, and to execute the action of an electronic shutter by changing the difference in potential between the pixel electrode 11 and the counter electrode 12.

The first photoelectric conversion film 150a and the second photoelectric conversion film 150b may be, for example, a film formed by the codeposition of 2-{[7-(5-N, N-ditolylaminothiophen-2-yl)-2,1,3-benzothiadiazol-4-yl] methylene}malononitrile (DTDCTB) and $C_{70}$ fullerene or a film formed by the codeposition of tin naphthalocyanine and $C_{70}$ fullerene. Specifically, the first photoelectric conversion film 150a and the second photoelectric conversion film 150b may be composed of the following materials. The first photoelectric conversion film 150a and the second photoelectric conversion film 150b typically each include an electron-donating (i.e., donor-type or p-type) molecule and an electron-accepting (i.e., acceptor-type or n-type) molecule.

A typical example of the electron-donating molecule is a p-type organic semiconductor which is likely to donate electrons, such as a hole-transporting organic compound. Examples of the p-type organic semiconductor include tri-arylamines, such as DTDCTB; benzidines; pyrazolines; styrylamines; hydrazones; triphenylmethanes; carbazoles; polysilanes; thiophenes, such as α-sexithiophene (α-6T) and poly-3-hexylthiophene (P3HT); phthalocyanines; cyanines; merocyanines; oxonols; polyamines; indoles; pyrroles; pyrazoles; polyarylenes; condensed aromatic carbocyclic compounds (e.g., a naphthalene derivative, an anthracene derivative, a phenanthrene derivative, a tetracene derivative, such as rubrene, a pyrene derivative, a perylene derivative, and a fluoranthene derivative); and metal complexes including a ligand that is a nitrogen-containing heterocyclic compound. Examples of the phthalocyanines include copper phthalocyanine (CuPc), subphthalocyanine (SubPc), aluminum chloride phthalocyanine (ClAlPc), $Si(OSiR_3)_2Nc$ (where R represents an alkyl group having 1 to 18 carbon atoms and Nc represents naphthalocyanine), tin naphthalocyanine (SnNc), and lead phthalocyanine (PbPc). Examples of the donor-type organic semiconductor are not limited to the above compounds. Any organic compound having a lower ionization potential than an organic compound used as an n-type (acceptor-type) organic compound may be used as a donor-type organic semiconductor. The ionization potential is the difference in energy level between the vacuum level and the highest occupied molecular orbital (HOMO).

A typical example of the electron-accepting molecule is an n-type organic semiconductor that is likely to accept electrons, such as an electron-transporting organic compound. Examples of the n-type organic semiconductor include fullerene (e.g., $C_{60}$ or $C_{70}$), fullerene derivatives (e.g., phenyl-$C_{61}$-butyric acid methyl ester (PCBM)), condensed aromatic carbocyclic compounds (e.g., a naphthalene derivative, an anthracene derivative, a phenanthrene derivative, a tetracene derivative, a pyrene derivative, a perylene derivative, and a fluoranthene derivative), five- or seven-membered heterocyclic compounds containing a nitrogen atom, an oxygen atom, or a sulfur atom (e.g., pyridine, pyradine, pyrimidine, pyridadine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridadine, triazolopyrimidine, tetrazaindene, oxadiazole, imidazopyridine, pyrrolidine, pyrrolopyridine, thiadiazolopyridine, dibenzazepine, and tribenzazepine), subphthalocyanines (SubPc), polyarylenes, fluorenes, cyclopentadienes, silyl compounds, perylenetetracarboxylic diimides (PTCDI), and metal complexes including a nitrogen-containing heterocyclic compound as a ligand. Examples of the acceptor-type organic semiconductor are not limited to the above compounds. Any organic compound having a larger electron affinity than an organic compound used as a p-type (donor-type) organic compound may be used as an acceptor-type organic semiconductor. The electron affinity is the difference in energy level between the vacuum level and the lowest unoccupied molecular orbital (LUMO).

The first photoelectric conversion film 150a may be composed of, for example, an organic semiconductor material having a photoelectric conversion sensitivity in the visible region. The second photoelectric conversion film 150b may be composed of, for example, an organic semiconductor material having a sensitivity in the infrared region.

The above-described advantageous effects may also be achieved by creating an energy barrier at the interface between the first photoelectric conversion film 150a and the second photoelectric conversion film 150b of the photosensitive layer 15A. For example, in the case where holes are to be accumulated as signal charge carriers, the ionization potentials of the first photoelectric conversion film 150a and the second photoelectric conversion film 150b are selected such that an energy barrier of, for example, 0.2 eV or more to holes is created at the interface between the first photoelectric conversion film 150a and the second photoelectric conversion film 150b of the photosensitive layer 15A.

In the case where an energy barrier is not created at the interface between the first photoelectric conversion film 150a and the second photoelectric conversion film 150b, the voltage dependence of the wavelength sensitivity characteristic varies with the resistances of the first photoelectric conversion film 150a and the second photoelectric conversion film 150b, and the order in which the photoelectric conversion films are stacked on top of each other does not affect the action of switchover of the wavelength sensitivity characteristic. However, there are preferable stacking conditions in terms of the efficiency of photoelectric conversion. As described above, the photoelectric conversion films are commonly composed of a mixture of an electron-donating organic semiconductor material and an electron-accepting organic semiconductor material. The electron-accepting material may be $C_{60}$ fullerene, $C_{70}$ fullerene, or an analog to these fullerenes. This is because the LUMO of fullerene spreads spatially in the form of a spherical shell, which enables electrons to migrate from an electron-donating organic semiconductor material that is brought into contact with the electron-accepting material into fullerene molecules with high efficiency. Accordingly, in order to produce a high-efficiency photoelectric conversion element, the photoelectric conversion films may be formed using a mixture of an electron-donating organic semiconductor material having an absorption at desired wavelengths and fullerene or an analog to fullerene. It is known that fullerene and analogs to fullerene commonly have a strong absorption in the visible region and, in particular, at wavelengths corresponding to blue. Therefore, an infrared photoelectric conversion film composed of an electron-donating organic semiconductor material having an absorption at the infrared region has an absorption in not only the infrared region but also the visible region. In such a case, if the photoelectric conversion films are stacked on top of each other such that the first photoelectric conversion film 150a is the infrared photoelectric conversion film and the second photoelectric conversion film 150b is a visible photoelectric conversion film sensible in the visible region, the first photoelectric conversion film disposed on the light-incident side absorbs part of the visible light and reduces the amount of visible light incident on the second photoelectric conversion film, which is a visible photoelectric conversion film. Therefore, in such a case, using the visible photoelectric conversion film and the infrared photoelectric conversion film as the first photoelectric conversion film 150a and the second photoelectric conversion film 150b, respectively, may limit the reduction in the amount of visible light incident on the second photoelectric conversion film. On the other hand, a visible photoelectric conversion film composed of an electron-donating organic semiconductor capable of absorbing visible light and fullerene or an analog to fullerene does not have an absorption in the infrared region. Therefore, even when the above visible photoelectric conversion film is disposed on the light-incident side, it allows infrared light to transmit therethrough and enables a sufficient amount of infrared light to reach the infrared photoelectric conversion film. As described above, in order to perform imaging in a suitable manner, the order in which the plurality of photoelectric conversion films are stacked on top of one another may be determined such that a sufficient amount of light of desired wavelengths reaches a desired photoelectric conversion film.

Example Action of Imaging Apparatus 100

Figure 4:
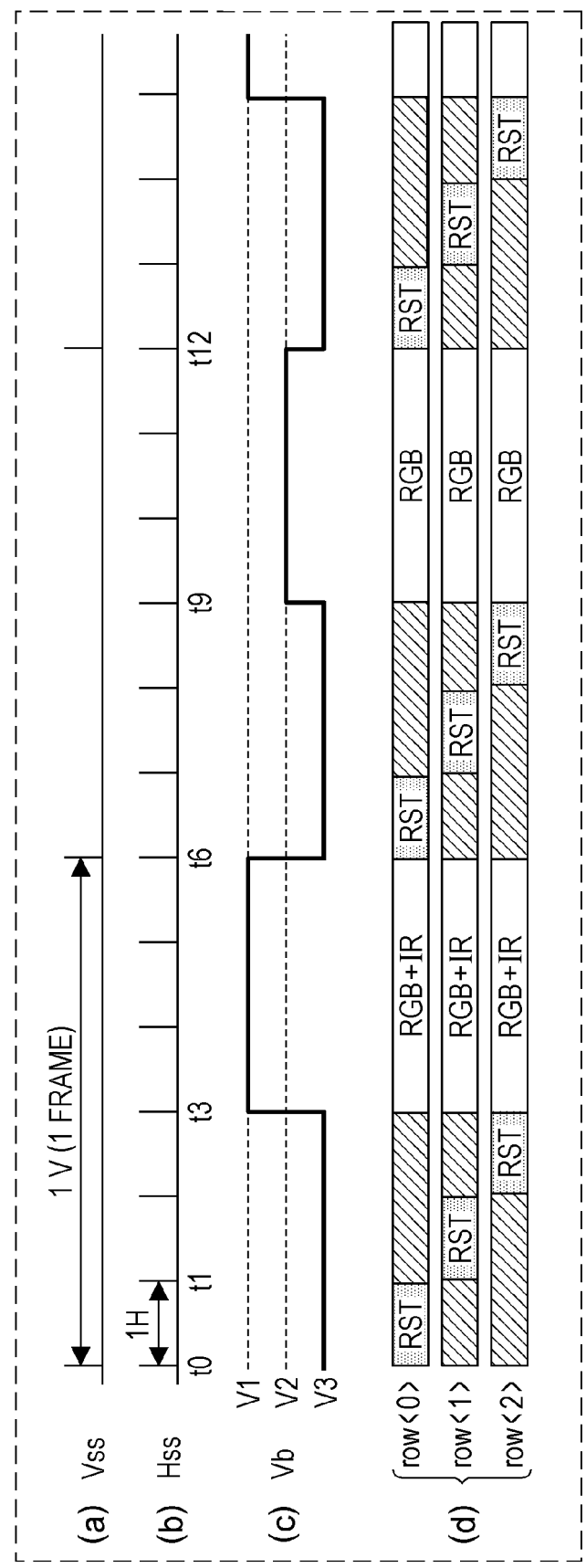
FIG. 4 includes timing charts used for explaining an example of the action of an imaging apparatus according to an embodiment.

FIG. 4 includes timing charts for explaining an example of the action of the imaging apparatus according to an embodiment of the present disclosure. FIGS. 4(a) and 4(b) each illustrate the timing of the rise or fall of a synchronizing signal. FIG. 4(c) illustrates a change in the bias voltage applied to the photoelectric conversion layer 15 with time. FIG. 4(d) illustrates the timing of the reset and exposure of each row of the pixel array 200 (see FIG. 1). Specifically, FIG. 4(a) illustrates the timing of the rise or fall of a vertical synchronizing signal Vss. FIG. 4(b) illustrates the timing of the rise or fall of a horizontal synchronizing signal Hss. FIG. 4(c) illustrates a change, with time, in the voltage Vb applied from the voltage supply circuit 32 to the counter electrodes 12 via the sensitivity control lines 42. FIG. 4(d) illustrates the timing of the reset and exposure of each row of the pixel array 200. The change, with time, in the voltage Vb applied from the voltage supply circuit 32 to the counter electrodes 12 via the sensitivity control lines 42 corresponds to a change, with time, in the potential of the counter electrode 12 with respect to the potential of the pixel electrode 11.

While FIG. 4 illustrates an example case where the pixel array 200 includes unit pixels 10 arranged in three rows for the sake of simplicity, the unit pixels included in the pixel array 200 may be arranged in four or more rows.

An example of the action of the imaging apparatus 100 is described below with reference to FIGS. 1, 2, and 4. For the sake of simplicity, an example of the action of an imaging apparatus 100 that includes a pixel array 200 including pixels arranged in three rows in total, that is, the row <0>, the row <1>, and the row <2>, is described below.

For acquiring an image, first, the charge accumulation region of each of the unit pixels 10 included in the pixel array 200 is reset and, when the pixel array 200 has been exposed to light prior to resetting, a pixel signal is read from each of the reset unit pixels 10. For example, as illustrated in FIG. 4, the resetting of a plurality of pixels in the row <0> is started in response to the vertical synchronizing signal Vss (Time t0). In FIG. 4, the shaded rectangular portions schematically represent a period in which a signal is read. The readout period includes a resetting period in which the potential of the charge accumulation region of each unit pixel 10 is reset.

For resetting the pixels in the row <0>, the address transistors 26 whose gates are connected to the specific one of the address control lines 46 which is associated with the row <0> are turned on by controlling the potential of the address control line 46. Furthermore, the reset transistors 28 whose gates are connected to the specific one of the reset control lines 48 which is associated with the row <0> are turned on by controlling the potential of the reset control line 48. Thus, the charge accumulation node 41 and the reset voltage line 44 are connected to each other, and a reset voltage Vr is supplied to the charge accumulation node 41, which is the charge accumulation region. Specifically, the potential of the gate electrode 24g of each signal detection transistor 24 and the potential of the pixel electrode 11 of each photoelectric conversion unit 13 are reset to be the reset voltage Vr. Subsequently, a pixel signal is read from each of the reset unit pixels 10 in the row <0> via the corresponding one of the vertical signal lines 47. These pixel signals are responsive to the reset voltage Vr. Subsequent to the readout of the pixel signals, the reset transistors 28 and the address transistors 26 are turned off.

In this example, the pixels in each of the row <0>, the row <1>, and the row <2> are reset sequentially on a row-by-row basis in response to the horizontal synchronizing signal Hss as schematically illustrated in FIG. 4. Hereinafter, the intervals between the pulses of the horizontal synchronizing signal Hss, that is, the period from when a row is selected to when the next row is selected, is referred to as "1H period". In this example, the period between Time t0 and Time t1 corresponds to the 1H period.

As illustrated in FIG. 4, a third voltage V3 at which the sensitivity of the photoelectric conversion layer 15 in a predetermined wavelength range becomes substantially zero is applied by the voltage supply circuit 32 between the pixel electrode 11 and the counter electrode 12 during at least a resetting period in which all of the charge accumulation regions included in the respective unit pixels 10 of the pixel array 200 are reset and the period (Time t0 to Time t3) from the start of the acquisition of the image to the end of the resetting of all the rows of the pixel array 200 and the readout of pixel signals. The third voltage V3 is, for example, 0 volt (V). In other words, applying a bias voltage, that is, the third voltage V3, to the photoelectric conversion layer 15 included in the photoelectric conversion unit 13 creates the period from the timing (Time t0) of the start of the acquisition of the image signal from the pixel array 200 to the start (Time t3) of the exposure period, that is, the non-exposure period.

While the bias voltage, that is, the third voltage V3, is applied to the photoelectric conversion layer 15, the migration of signal charge carriers from the photoelectric conversion layer 15 to the charge accumulation region is negligible. This is presumably because, while the bias voltage, that is, the third voltage V3, is applied to the photoelectric conversion layer 15, positive and negative charge carriers generated as a result of the photoelectric conversion layer 15 being irradiated with light quickly recombine with each other and disappear before collected by the pixel electrode 11. Accordingly, while the bias voltage, that is, the third voltage V3, is applied to the photoelectric conversion layer 15, the accumulation of signal charge carriers at the charge accumulation region is negligible even when the photoelectric conversion layer 15 is irradiated with light. This reduces the occurrence of unintended sensitivity in the non-exposure period (hereinafter, this sensitivity is referred to as "parasitic sensitivity").

In a row (e.g., the row <0>) of FIG. 4(d), the periods represented by the heavily shaded rectangular portion and the lightly shaded rectangular portion are non-exposure periods. The third voltage V3 is not limited to be 0 V.

Figure 5:
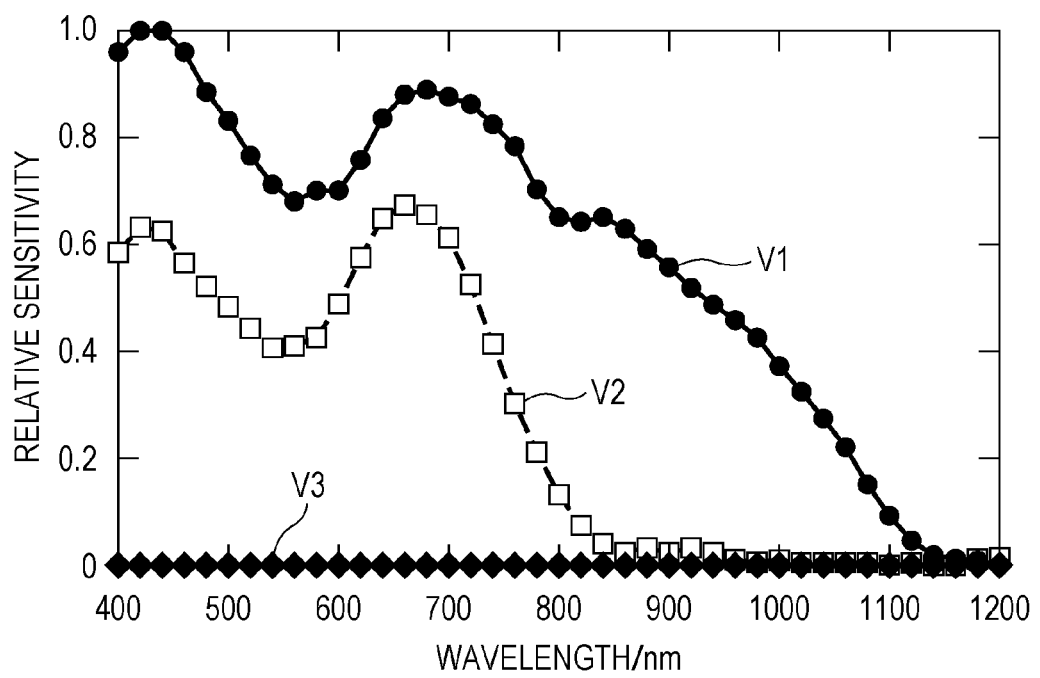
FIG. 5 is a diagram illustrating an example of the voltage dependence of the spectral sensitivity characteristic of a photoelectric conversion layer included in an imaging apparatus according to an embodiment.

Subsequent to the resetting of all the rows of the pixel array 200 and the readout of pixel signals, exposure is started in response to the horizontal synchronizing signal Hss (Time t3). In FIG. 4(d), the blank rectangular portions schematically represent the exposure period in each row. In FIG. 4, the non-exposure periods denoted by the shaded rectangle portions have the same length as the exposure periods denoted by the blank rectangular portions for the sake of simplicity; the non-exposure periods and the exposure periods do not necessarily have the same length. The length of the exposure periods may be adjusted adequately in accordance with the darkness of the subject, the speed of motion of the subject, and the like. The exposure period starts upon the voltage supply circuit 32 changing the voltage applied between the pixel electrode 11 and the counter electrode 12 to a first voltage V1 (or a second voltage V2) which is different from the third voltage V3. The first voltage V1 is, for example, the voltage at which the photoelectric conversion thresholds of all the sublayers of the photosensitive layer 15A are reached and all the sublayers of the photosensitive layer 15A come to have a sensitivity. Upon the first voltage V1 being applied to the photoelectric conversion layer 15, the signal charge carriers (in this example, holes) generated in the photoelectric conversion layer 15 are collected by the pixel electrode 11 and accumulated at the charge accumulation region. FIG. 5 illustrates an example of the voltage dependence of the wavelength sensitivity characteristic of the photoelectric conversion layer 15 included in the imaging apparatus 100 according to the embodiment. In this embodiment, signal charge carriers generated by the photoelectric conversion of light in the visible and infrared regions are accumulated at the charge accumulation region in accordance with the wavelength sensitivity characteristic illustrated in FIG. 5. In FIG. 4(d), the periods denoted by the blank rectangular portions labeled as "RGB+IR" are the exposure periods during which signal charge carriers generated by the photoelectric conversion of light in the visible and infrared regions are accumulated at the charge accumulation region.

The exposure period is terminated upon the voltage supply circuit 32 changing the voltage applied between the pixel electrode 11 and the counter electrodes 12 to the third voltage V3 (Time t6). Subsequently, signal charge is read from the pixels in each row of the pixel array 200 in response to the horizontal synchronizing signal Hss. In this example, signal charge is read from the pixels in each of the row <0>, the row <1>, and the row <2> sequentially on a row-by-row basis from Time t6. Hereinafter, the period from when pixels in a row are selected to when the pixels in the row are again selected may be referred to as "1V period". In this example, the period from Time t0 to Time t6 corresponds to the 1V period. The 1V period corresponds to one frame. In the exposure period of an 1V period next to the 1V period in which the first voltage V1 is applied to the photoelectric conversion layer 15, the voltage applied to the photoelectric conversion layer 15 is changed to a second voltage V2 different from the first voltage V1 or the third voltage V3. The second voltage V2 is, for example, a voltage at which one of the photoelectric conversion thresholds of the sublayers of the photosensitive layer 15A is reached. The second voltage V2 is, for example, a voltage intermediate between the first voltage V1 and the third voltage V3. In this embodiment, while the voltage applied to the photoelectric conversion layer 15 is the second voltage V2, signal charge carriers generated by the photoelectric conversion of only the light in the visible region are accumulated at the charge accumulation region as illustrated in FIG. 5. In FIG. 4(d), the periods denoted by the blank rectangular portions labeled as "RGB" are the exposure periods during which signal charge carriers generated by the photoelectric conversion of only the light in the visible region are accumulated at the charge accumulation region.

The exposure period is terminated when the voltage applied to the photoelectric conversion layer 15 is changed to the third voltage V3 (Time t12). Subsequently, signal charge is read from the pixels in each row of the pixel array 200 in response to the horizontal synchronizing signal Hss.

In the above-described embodiment of the present disclosure, the voltage applied between the pixel electrode 11 and the counter electrode 12 is set to the first voltage V1 or the second voltage V2 during the exposure period and to the third voltage V3 while the voltage applied to the photoelectric conversion layer 15 is changed from the first voltage V1 to the second voltage V2 or from the second voltage V2 to the first voltage V1, that is, during the non-exposure period that includes at least the period in which signal charge is read from all the charge accumulation regions. This enables two images to be acquired from the photoelectric conversion layer 15 with different wavelength sensitivity characteristics in a "global shutter" mode.

In addition, repeating an 1V period during which the first voltage V1 is applied between the pixel electrode 11 and the counter electrode 12 and an 1V period during which the second voltage V2 is applied between the pixel electrode 11 and the counter electrode 12 in an alternating manner enables acquisition of two moving images from the photoelectric conversion layer 15 with different wavelength sensitivity characteristics to be achieved substantially simultaneously with one imaging apparatus 100. Since the two moving images are acquired electrically in a global shutter mode, the distortion of a fast-moving subject can be reduced in any of the moving images.

The period during which the first voltage V1 is applied between the pixel electrode 11 and the counter electrode 12 and the period during which the second voltage V2 is applied between the pixel electrode 11 and the counter electrode 12 are not necessarily repeated alternately, and the switchover between the two voltages may be performed at any frequency. The frequency at which the switchover between the two voltages is performed may be determined in accordance with the number of frames. For example, the switchover between the two voltages may be performed once every several tens of frames. The switchover between the two voltages is not necessarily performed periodically and may be performed at a timing based on a trigger. In another case, in order to detect infrared light at desired timings, imaging information based on infrared light may be acquired, for example, only once a second in an imaging mode in which visible light and infrared light are used, while a color image is acquired, in normal times, in an imaging mode in which visible light is used.

In this embodiment, upon the first voltage V1 being applied to the photoelectric conversion layer 15, the photoelectric conversion layer 15 exhibits a wavelength sensitivity characteristic such that the photoelectric conversion layer 15 has a sensitivity in the visible region and a sensitivity equal to or higher than a predetermined first threshold in the infrared region. Upon the second voltage V2 lower than the first voltage V1 being applied to the photoelectric conversion layer 15, the photoelectric conversion layer 15 exhibits a wavelength sensitivity characteristic such that the photoelectric conversion layer 15 has a sensitivity equal to or higher than a predetermined second threshold only in the visible region. This enables the switchover between an exposure period in which visible and infrared wavelengths are used and an exposure period in which only visible wavelengths are used. As is clear from FIG. 4, in this example, the initiation (Time t3 and Time t9) and the termination (Time t6 and Time t12) of the exposure period are each performed at the same timing over all the pixels included in the pixel array 200. In other words, the action described above is a "global shutter" mode.

On the other hand, in the case where the voltage applied between the pixel electrode 11 and the counter electrode 12 is not set to the third voltage V3 when it is changed between the first voltage V1 and the second voltage V2, it is not possible to electrically create the non-exposure state. Consequently, the acquisition of images is done in a "rolling shutter" mode. Furthermore, the two types of signal charge carriers which are generated in the photoelectric conversion layer 15 with different wavelength sensitivity characteristics, that is, the signal charge carriers resulting from only visible light and the signal charge carriers resulting from light of visible and infrared wavelengths, are accumulated at the charge accumulation region in a mixed state. This makes it difficult to acquire a correct image.

In this embodiment, subsequent to the termination of the exposure period, the address transistors 26 in the row <0> are turned on in order to read signal charge from the pixels in the row <0>. This allows the pixel signals responsive to the amounts of charge carriers accumulated at the respective charge accumulation regions during the exposure period to be output through the vertical signal lines 47. Subsequent to the readout of the pixel signals, the pixels may be reset by turning on the reset transistors 28 in order to read the reset voltage of the pixels as a reference signal of the pixels. Subsequent to the readout of the pixel signals, the address transistors 26 (and the reset transistors 28) are turned off. Subsequent to the readout of the signal charge from the pixels in each row of the pixel array 200, the difference between the pixel signals read at Time t0 and the reference signals read at Time t3 is determined in order to remove fixed noises contained in the signals.

In the above period, the third voltage V3 is applied between the pixel electrode 11 and the counter electrode 12, that is, a bias voltage is applied to the photoelectric conversion layer 15 such that the sensitivity of the photoelectric conversion layer 15 becomes substantially zero. Therefore, in the above period, the accumulation of signal charge carriers at the charge accumulation region is negligible even when the photoelectric conversion layer 15 is irradiated with light. This reduces the likelihood of noise being caused as a result of unintended charge carriers mixing in the photoelectric conversion layer 15.

Alternatively, in order to reduce the likelihood of the signal charge carriers being further accumulated at the charge accumulation region during the non-exposure period, the exposure period may be terminated by applying a voltage having the same magnitude as the third voltage V3 and a polarity opposite to the third voltage V3 between the pixel electrode 11 and the counter electrode 12. However, simply reversing the polarity of the voltage applied between the pixel electrode 11 and the counter electrode 12 may cause the signal charge carriers accumulated at the charge accumulation region to migrate into the counter electrode 12 through the photoelectric conversion layer 15. The migration of the signal charge carriers is observed as black dots in the acquired image. That is, the migration of the signal charge carriers from the charge accumulation region to the counter electrode 12 through the photoelectric conversion layer 15 during the non-exposure period may result in a negative parasitic sensitivity.

In this embodiment, the exposure period is terminated by changing the voltage applied to the photoelectric conversion layer 15 to the third voltage V3, that is, a bias voltage at which the sensitivity of the photoelectric conversion layer 15 becomes substantially zero is applied to the photoelectric conversion layer 15 subsequent to the accumulation of the signal charge carriers at the charge accumulation region. While the third voltage V3 is applied to the photoelectric conversion layer 15 as a bias voltage, the likelihood of the signal charge carriers accumulated at the charge accumulation region migrating to the counter electrode 12 through the photoelectric conversion layer 15 can be reduced. In other words, applying the third voltage V3 to the photoelectric conversion layer 15 enables the signal charge carriers accumulated during the exposure period to be stored at the charge accumulation region. That is, applying the third voltage V3 to the photoelectric conversion layer 15 may reduce the likelihood of the negative parasitic sensitivity being caused as a result of the signal charge carriers being lost from the charge accumulation region.

As described above, in this embodiment, the initiation and termination of the exposure period and the imaging wavelength during the exposure period are controlled by changing the voltage Vb applied between the pixel electrode 11 and the counter electrode 12. That is, according to this embodiment, it is possible to perform imaging by simultaneously changing the imaging wavelength of each of the unit pixels 10.

Organic photoelectric conversion elements that include a photoelectric conversion layer including an organic semiconductor material have a more simple structure and are capable of being produced by a more simple process than inorganic photoelectric conversion elements that include photodiodes which are known in the related art. In addition, it is possible to readily design the wavelength range in which an organic semiconductor material contributes to photoelectric conversion. This makes it possible to realize a photoelectric conversion element having a desired wavelength sensitivity characteristic.

In the case where an image sensor that includes a plurality of organic photoelectric conversion elements is used, the sensitivity of the image sensor can be changed for each exposure period by changing the voltages applied to the photoelectric conversion elements, but the imaging wavelength of the image sensor cannot be changed for each exposure period. One of the methods for changing the imaging wavelength is to detachably attach a filter that transmits only light having desired wavelengths onto the front surface of the image sensor. However, in such a case, the size of the apparatus is increased. Furthermore, it is not possible to perform good imaging while the filter is attached to or removed from the image sensor.

Method for Extracting Infrared Image Signal

A method for extracting an infrared image signal with the imaging apparatus 100 according to the embodiment is described below. Hereinafter, imaging using visible light is referred to as "imaging in the RGB mode", and imaging using visible light and infrared light is referred to as "imaging in the RGB+IR mode" for the sake of simplicity.

Figure 6A:
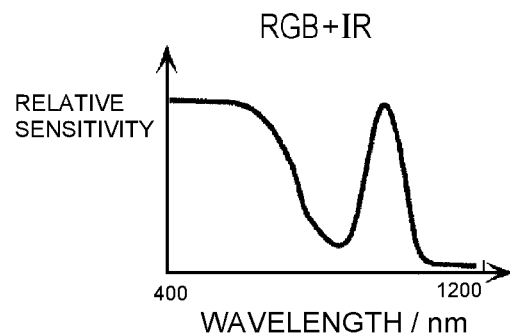
FIG. 6A is a diagram illustrating an example of the spectral sensitivity characteristic of a photoelectric conversion layer according to an embodiment with respect to visible light and infrared light.
Figure 6D:
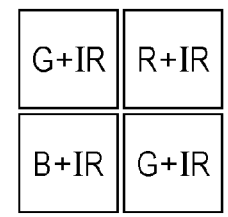
FIG. 6D is a schematic diagram illustrating the structure of the pixel according to an embodiment and signals acquired by the pixel in a visible-light-and-infrared mode.
Figure 6B:
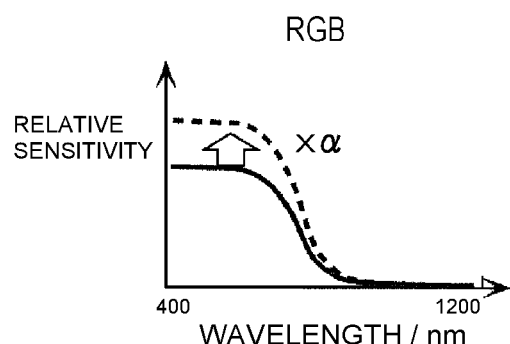
FIG. 6B is a diagram illustrating an example of the spectral sensitivity characteristic of a photoelectric conversion layer according to an embodiment with respect to visible light.
Figure 6E:
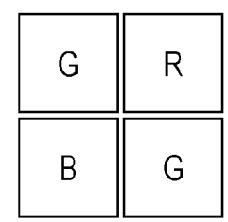
FIG. 6E is a schematic diagram illustrating the structure of the pixel according to an embodiment and signals acquired by the pixel in a visible-light mode.
Figure 6C:
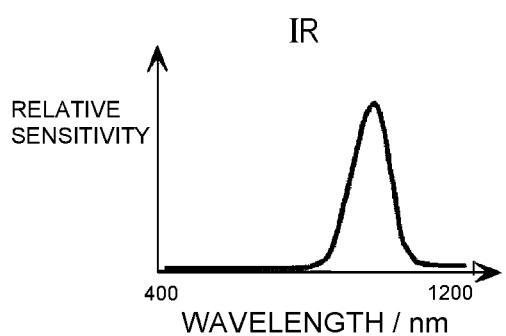
FIG. 6C is a diagram illustrating an example of the spectral sensitivity characteristic of a photoelectric conversion layer according to an embodiment with respect to infrared light.
Figure 6F:
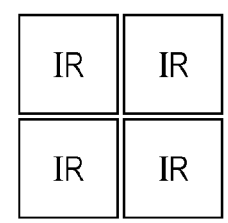
FIG. 6F is a schematic diagram illustrating the structure of the pixel according to an embodiment and signals acquired by the pixel in an infrared mode.

FIGS. 6A to 6F are diagrams for explaining the method for extracting an infrared image signal. FIG. 6A is a curve illustrating the spectral sensitivities of the image sensor to visible light and infrared light (in FIG. 6A, referred to as "RGB+IR") which is measured during the application of the first voltage V1. FIG. 6B is a curve illustrating the spectral sensitivities of the image sensor to visible light (in FIG. 6B, referred to as "RGB") which is measured during the application of the second voltage V2. FIG. 6C is a curve illustrating spectral sensitivities to infrared light (in FIG. 6C, referred to as "IR"). In FIGS. 6A to 6C, the horizontal axis shows the wavelength of light and the vertical axis shows sensitivity. As illustrated in FIGS. 6D to 6F, each of the pixels has a Bayer pattern consisting of, for example, one R-subpixel, two G-subpixels, and one B-subpixel. A pixel array having the Bayer pattern can be formed by arranging color filters including a dye, a pigment, or the like on the image sensor such that each of the color filters has a transmittance corresponding to a specific one of R, G, and B. In other words, the wavelength dependence of a signal generated in each of the pixels is determined from the product of the spectral sensitivity curve of the image sensor and the transmittance curve of the color filter used. Common dye color filters and pigment color filters have a high transmittance in not only the desired wavelength region but also the infrared region. Specifically, a color filter used for R-subpixels has a high transmittance to red (R) and infrared light, a color filter used for G-subpixels has a high transmittance to green (G) and infrared light, and a color filter used for B-subpixels has a high transmittance to blue (B) and infrared light. Accordingly, in the RGB mode, a signal corresponding to red (R) is generated in the R-subpixels, a signal corresponding to green (G) is generated in the G-subpixels, and a signal corresponding to blue (B) is generated in the B-subpixels as illustrated in FIG. 6E. On the other hand, in the RGB+IR mode, a signal corresponding to red and infrared (i.e., R+IR) is generated in the R-subpixels, a signal corresponding to green and infrared (i.e., G+IR) is generated in the G-subpixels, and a signal corresponding to blue and infrared (i.e., B+IR) is generated in the B-subpixels as illustrated in FIG. 6D.

The image signal obtained in the RGB+IR mode contains signals based on RGB color information that transmits R, G, and B color filters which are superimposed on a signal based on infrared light as in the spectral sensitivity curve illustrated in FIG. 6A. Therefore, it is not possible to directly image only the signal information based on infrared light. However, in the case where the spectral sensitivity curve in the RGB+IR mode has the same shape in the visible region as the spectral sensitivity curve in the RGB mode as illustrated in FIGS. 6A and 6B, it is possible to replicate the RGB component of the image signal acquired in the RGB+IR mode by multiplying the image signal acquired in the RGB mode by a predetermined gain α. In FIG. 6B, the spectral sensitivity curve in the RGB mode is denoted by a solid line, and the spectral sensitivity curve magnified by the coefficient α is denoted by a dotted line.

The gain α includes gains $α_R$, $α_G$, and $α_B$. The R-signal generated in the R-subpixels in the RGB mode is multiplied by the gain $α_R$. The G-signal generated in the G-subpixels in the RGB mode is multiplied by the gain $α_G$. The B-signal generated in the B-subpixels in the RGB mode is multiplied by the gain $α_B$. Consequently, a signal corresponding to the RGB components of the image signal acquired in the RGB+IR mode is generated from the image signal acquired in the RGB mode.

The signal generated by multiplying the image signal acquired in the RGB mode by the gain α is subtracted from the image signal acquired in the RGB+IR mode to obtain an image signal corresponding to infrared light as illustrated in FIGS. 6C and 6F.

The above processing is performed by the computing circuit 50 illustrated in FIG. 1. The computing circuit 50 is included in a signal processing circuit that includes a microprocessor, such as a digital signal processor (DSP). The computing circuit 50 may alternatively be disposed in the image sensor that includes the unit pixels 10.

As described above, in each of the plurality of exposure periods, the computing circuit 50 (i) acquires a first signal corresponding to an image captured using visible light and infrared light upon a first voltage being applied between the pixel electrode 11 and counter electrode 12; (ii) acquires a second signal corresponding to an image captured using visible light upon a second voltage different from the first voltage being applied between the pixel electrode 11 and counter electrode 12; and (iii) generates a third signal corresponding to an image captured using infrared light by performing a predetermined computation using the first signal and the second signal.

Thus, the imaging apparatus 100 is capable of performing a switchover between imaging using visible light and imaging using visible light and infrared light simultaneously for all pixels by changing the voltage applied to the photoelectric conversion layer 15. The imaging apparatus 100 is also capable of generating an image captured using infrared light from an image captured in the visible region and an image captured in the visible and infrared regions. Thus, the imaging apparatus 100 is capable of capturing an image based on visible light, an image based on visible light and infrared light, and an image based on infrared light without using a movable filter.

A method for calculating the gain α is described below.

It is possible to remove the RGB color information and extract only the infrared signal information from the signals generated in each of the pixels in the RGB+IR mode by using ratios $\eta_R$, $\eta_G$, and $\eta_B$, which are the ratios of the quantum efficiency in the RGB+IR mode to the quantum efficiency in the RGB mode in the R, G, and B wavelength regions, respectively, of the spectral sensitivity curves illustrated in FIG. 5.

The ratios $\eta_R$, $\eta_G$, and $\eta_B$ are represented by Formulae (1) to (3) below, where $Q1_R$, $Q1_G$, and $Q1_B$ represent the quantum efficiencies in the RGB+IR mode which correspond to red (R), green (G), and blue (B), and $Q2_R$, $Q2_G$, and $Q2_B$ represent the quantum efficiencies in the RGB mode which correspond to red (R), green (G), and blue (B).

$$\alpha_R = \eta_R = Q1_R/Q2_R \quad (1)$$

$$\alpha_G = \eta_G = Q1_G/Q2_G \quad (2)$$

$$\alpha_B = \eta_B = Q1_B/Q2_B \quad (3)$$

Thus, α=Q1/Q2 is satisfied, where Q1 includes $Q1_R$, $Q1_G$, and $Q1_B$, and Q2 includes $Q2_R$, $Q2_G$, and $Q2_B$.

Figure 7:
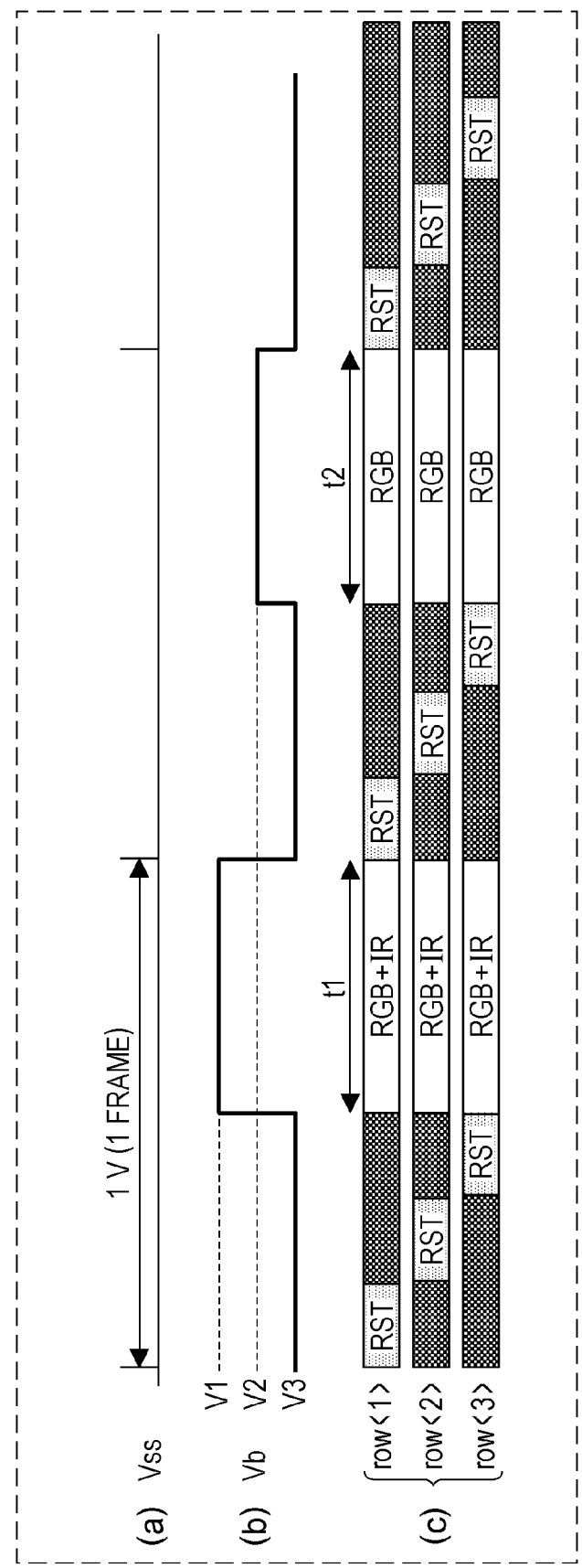
FIG. 7 includes diagrams illustrating an example of a switchover between modes performed by an imaging apparatus according to an embodiment.
Figure 8:
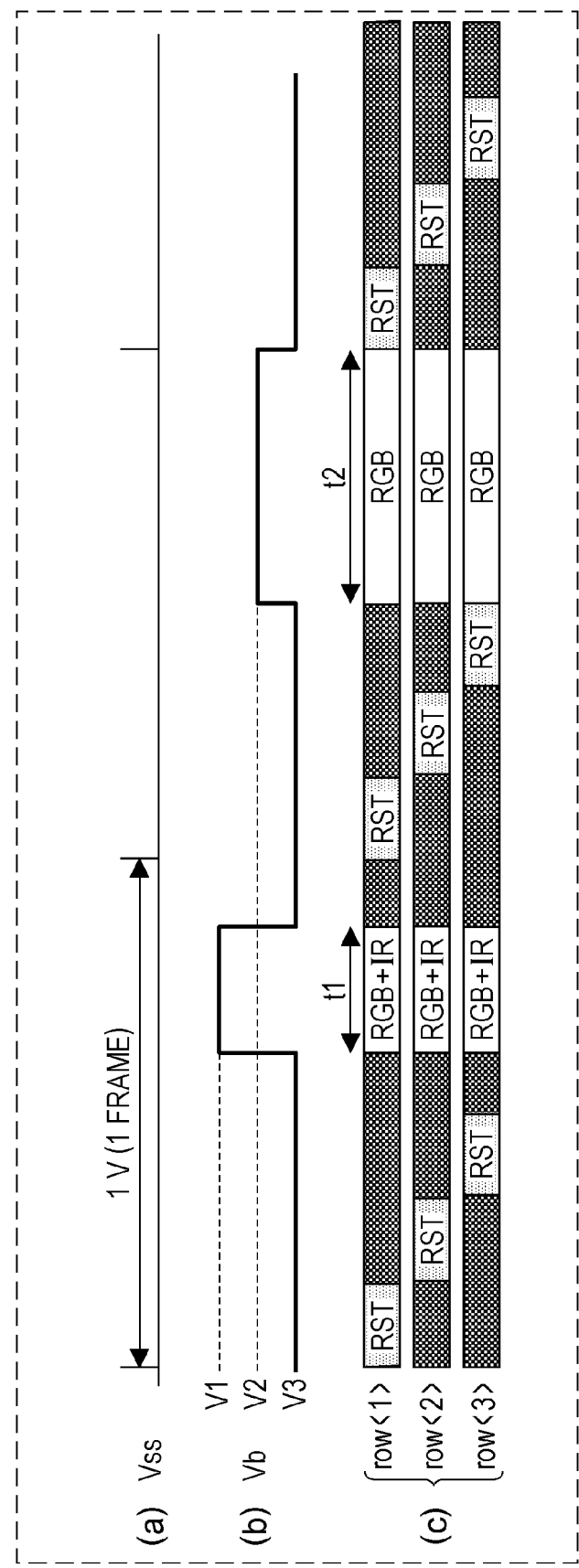
FIG. 8 includes diagrams illustrating another example of a switchover between modes performed by an imaging apparatus according to an embodiment.

In the above description, it is assumed that the exposure time t1 for the RGB+IR mode be equal to the exposure time t2 for the RGB mode as illustrated in FIG. 7. In the case where the exposure time t1 for the RGB+IR mode is different from the exposure time t2 for the RGB mode as illustrated in FIG. 8, the following computation is performed. FIGS. 7(a) and 8(a) each illustrate the timing of the rise or fall of the vertical synchronizing signal Vss. FIGS. 7(b) and 8(b) each illustrate a change in the bias voltage applied to the photoelectric conversion layer 15 with time. FIGS. 7(c) and 8(c) each illustrate the timing of the reset and exposure of each row of the pixel array 200.

The amount of signal charge is determined on the basis of the product of the sensitivity of the sensor (i.e., the quantum efficiency) and the length of the exposure time. Accordingly, it is possible to extract an infrared image by setting the gain α to the values represented by Formulae (4) to (6) below on the basis of the exposure time t1 for the RGB+IR mode and the exposure time t2 for the RGB mode.

$$\alpha_R = \eta_R \times (t1/t2) \quad (4)$$

$$\alpha_G = \eta_G \times (t1/t2) \quad (5)$$

$$\alpha_B = \eta_B \times (t1/t2) \quad (6)$$

Thus, α=(Q1/Q2)×(t1/t2) is satisfied.

While the signals acquired in the RGB mode are multiplied by the gain α in the above-described case, the method is not limited to this; any method in which the ratio between the signal acquired in the RGB+IR mode and the signal acquired in the RGB mode can be changed as described above may be used. For example, the signal acquired by the RGB+IR mode may be multiplied by a gain. Alternatively, the signal acquired in the RGB+IR mode and the signal acquired in the RGB mode may be multiplied by different gains. Specifically, α1/α2=Q2/Q1 needs to be satisfied, where α1 represents the gain by which the signal acquired by the RGB+IR mode is multiplied and α2 represents the gain by which the signal acquired in the RGB mode is multiplied. In the case where the exposure time differs between the two modes, α1/α2=(Q2/Q1)×(t2/t1) needs to be satisfied.

Since the gain α is equal to 1 when the exposure time ratio t1/t2 is set to be 1/η, setting the exposure time ratio t1/t2 to be 1/η enables the subtraction to be performed directly without using an additional amplifier.

In general, the quantum efficiency for the RGB mode decreases with a reduction in the voltage applied to the photoelectric conversion layer. Setting the length of the exposure time t2 for the RGB mode to be longer than the exposure time t1 for the RGB+IR mode as illustrated in FIG. 8 enables acquisition of a sufficient amount of signals and, as a result, increases the accuracy with which the difference in the amount of signals generated in the pixels between the RGB+IR mode and the RGB mode is computed.

When the exposure time in the RGB+IR mode is too short to provide a sufficient amount of light, the photoelectric conversion layer 15 may be irradiated with light emitted from an additional high-intensity infrared emitter. The light may be either continuous light or pulsed light. When the light is pulsed light synchronized with the RGB+IR-mode exposure period, the power consumption of the infrared emitter can be reduced.

The imaging apparatus according to the embodiment is described above. The above-described embodiment does not limit the present disclosure.

The processing units included in the imaging apparatus according to the above embodiment are implemented typically as an LSI, which is an integrated circuit. The processing units may be each individually integrated into one chip, or some or all of the processing units may alternatively be integrated into one ship.

The type of the integrated circuit is not limited to an LSI. The processing units may be implemented as a dedicated circuit or a general-purpose processor. It is also possible to use a field programmable gate array (FPGA), which allows programming after the production of the LSI, or a reconfigurable processor, which enables reconfiguration of connection between circuit cells inside the LSI and settings of the circuit cells.

An imaging apparatus according to one or more aspects is described above on the basis of the embodiment. The present disclosure is not limited by the embodiment. Various modifications and forms resulting from combinations of elements of the different embodiments that may be conceived by those skilled in the art may be included within the scope of the one or more aspects without departing from the scope of the present disclosure.

What is claimed is:

1. An imaging apparatus comprising:
   a pixel including
      a pixel electrode,
      a charge accumulation region electrically connected to the pixel electrode, and
      a signal detection circuit electrically connected to the charge accumulation region;
   a counter electrode facing the pixel electrode;
   a photoelectric conversion layer disposed between the pixel electrode and the counter electrode,
   the photoelectric conversion layer converting first light having a first wavelength band into a first electrical signal upon a first voltage being applied between the pixel electrode and the counter electrode,
   the photoelectric conversion layer converting second light having a second wavelength band, the second wavelength band being different from the first wavelength band, into a second electrical signal upon a second voltage being applied between the pixel electrode and the counter electrode, the second voltage being different from the first voltage; and a computing circuit that acquires a first signal on a basis of the first electrical signal upon the first voltage being applied between the pixel electrode and the counter electrode, the first signal corresponding to an image captured with the first light, the computing circuit acquiring a second signal on a basis of the second electrical signal upon the second voltage being applied between the pixel electrode and the counter electrode, the second signal corresponding to an image captured with the second light, the computing circuit generating a third signal by performing a computation using the first signal and the second signal, the third signal corresponding to an image captured with third light having a third wavelength band, the third wavelength band being different from both the first wavelength band and the second wavelength band.

2. The imaging apparatus according to claim 1, further comprising a voltage supply circuit configured to selectively apply the first voltage or the second voltage between the pixel electrode and the counter electrode.

3. The imaging apparatus according to claim 1,
wherein the computing circuit generates the third signal by subtracting, from the first signal, a signal obtained by multiplying the second signal by a gain.

4. The imaging apparatus according to claim 3,
wherein the gain corresponds to a ratio of a quantum efficiency of the photoelectric conversion layer which is achieved upon the first voltage being applied between the pixel electrode and the counter electrode to a quantum efficiency of the photoelectric conversion layer which is achieved upon the second voltage being applied between the pixel electrode and the counter electrode.

5. The imaging apparatus according to claim 3,
wherein the gain corresponds to a product of
a ratio of a quantum efficiency of the photoelectric conversion layer which is achieved upon the first voltage being applied between the pixel electrode and the counter electrode to a quantum efficiency of the photoelectric conversion layer which is achieved upon the second voltage being applied between the pixel electrode and the counter electrode, and
a ratio of a first exposure time to a second exposure time, the first exposure time being a time during which the first voltage is applied between the pixel electrode and the counter electrode, the second exposure time being a time during which the second voltage is applied between the pixel electrode and the counter electrode.

6. The imaging apparatus according to claim 5,
wherein the first exposure time is shorter than the second exposure time.

7. The imaging apparatus according to claim 1,
wherein the computing circuit generates the third signal by subtracting a fifth signal from a fourth signal, the fourth signal being obtained by multiplying the first signal by a first gain, the fifth signal being obtained by multiplying the second signal by a second gain, the second gain being different from the first gain.

8. The imaging apparatus according to claim 7,
wherein a ratio of the first gain to the second gain corresponds to a ratio of a quantum efficiency of the photoelectric conversion layer which is achieved upon the first voltage being applied between the pixel electrode and the counter electrode to a quantum efficiency of the photoelectric conversion layer which is achieved upon the second voltage being applied between the pixel electrode and the counter electrode.

9. The imaging apparatus according to claim 7,
wherein a ratio of the first gain to the second gain corresponds to a product of
a ratio of a quantum efficiency of the photoelectric conversion layer which is achieved upon the first voltage being applied between the pixel electrode and the counter electrode to a quantum efficiency of the photoelectric conversion layer which is achieved upon the second voltage being applied between the pixel electrode and the counter electrode, and
a ratio of a first exposure time to a second exposure time, the first exposure time being a time during which the first voltage is applied between the pixel electrode and the counter electrode, the second exposure time being a time during which the second voltage is applied between the pixel electrode and the counter electrode.

10. The imaging apparatus according to claim 9,
wherein the first exposure time is shorter than the second exposure time.

11. The imaging apparatus according to claim 1,
wherein the photoelectric conversion layer includes photoelectric conversion films.

12. The imaging apparatus according to claim 11,
wherein at least one of the photoelectric conversion films includes an organic material.

13. An imaging apparatus comprising:
a first photoelectric conversion layer converting first light having a first wavelength band into a first electrical signal;
a second photoelectric conversion layer converting second light having a second wavelength band, the second wavelength band being different from the first wavelength band, into a second electrical signal; and
a computing circuit that acquires a first signal on a basis of the first electrical signal, the first signal corresponding to an image captured with the first light,
the computing circuit acquiring a second signal on a basis of the second electrical signal, the second signal corresponding to an image captured with the second light,
the computing circuit generating a third signal by performing a computation using the first signal and the second signal, the third signal corresponding to an image captured with third light having the third wavelength band, the third wavelength band being different from both the first wavelength band and the second wavelength band.

14. The imaging apparatus according to claim 13, further comprising:
pixels, wherein
the first photoelectric conversion layer includes first photoelectric conversion regions, each of the first photoelectric conversion regions corresponding to one of the pixels,
the second photoelectric conversion layer includes second photoelectric conversion regions, each of the second photoelectric conversion regions corresponding to one of the pixels, and
when viewed from a normal direction of the first photoelectric conversion layer, one of the second photoelectric conversion regions overlaps one of the first photoelectric conversion regions.

15. The imaging apparatus according to claim 13, wherein the second photoelectric conversion layer is stacked above the first photoelectric conversion layer.

16. The imaging apparatus according to claim 13, wherein at least one of the first photoelectric conversion layer and the second photoelectric conversion layer includes a photoelectric conversion film.

17. The imaging apparatus according to claim 16, wherein the photoelectric conversion film includes an organic semiconductor material.

* * * * *